(12) United States Patent
Jang et al.

(10) Patent No.: US 9,653,565 B2
(45) Date of Patent: May 16, 2017

(54) SEMICONDUCTOR DEVICES AND METHODS OF FABRICATING THE SAME

(71) Applicant: Samsung Electronics Co., Ltd, Suwon-Si, Gyeonggi-do (KR)

(72) Inventors: Byong-hyun Jang, Suwon-si (KR); Dongchul Yoo, Seongnam-si (KR); Jaeyoung Ahn, Seongnam-si (KR); Hunhyeong Lim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/865,078

(22) Filed: Sep. 25, 2015

(65) Prior Publication Data

US 2016/0093634 A1  Mar. 31, 2016

(30) Foreign Application Priority Data

Sep. 29, 2014 (KR) .......................... 10-2014-0130240

(51) Int. Cl.
*H01L 29/49* (2006.01)
*H01L 27/11582* (2017.01)

(52) U.S. Cl.
CPC ...... *H01L 29/495* (2013.01); *H01L 27/11582* (2013.01)

(58) Field of Classification Search
CPC ......... H01L 27/11568; H01L 27/11582; H01L 29/495
See application file for complete search history.

(56) References Cited

U.S. PATENT DOCUMENTS

| 8,017,993 | B2 | 9/2011 | Kidoh et al. |
| 8,309,405 | B2 | 11/2012 | Yang et al. |
| 8,455,940 | B2 | 6/2013 | Lee et al. |
| 8,581,321 | B2 | 11/2013 | Son et al. |
| 8,592,873 | B2 * | 11/2013 | Kim ................. H01L 27/11582 257/213 |
| 8,723,247 | B2 | 5/2014 | Komori et al. |
| 8,754,391 | B2 | 6/2014 | Seong et al. |
| 8,767,465 | B2 * | 7/2014 | Chang ............... H01L 21/28282 257/321 |

(Continued)

FOREIGN PATENT DOCUMENTS

| JP | 2011066348 A | 3/2011 |
| KR | 1020130019267 A | 2/2013 |
| KR | 1020050101996 A | 10/2015 |

*Primary Examiner* — Daniel Luke
*Assistant Examiner* — Khatib Rahman
(74) *Attorney, Agent, or Firm* — Ward and Smith, P.A.

(57) ABSTRACT

A three dimensional semiconductor memory device includes a vertical channel structure extending in a vertical direction on a substrate; interlayer insulating layers surrounding the vertical channel structure and being stacked in the vertical direction on the substrate, gate electrodes surrounding the vertical channel structure and being disposed between the interlayer insulating layers, corners of the gate electrodes adjacent to the vertical channel structure being rounded, and auxiliary gate insulating patterns disposed between the gate electrodes and the vertical channel structure, wherein a side surface of the auxiliary gate insulating pattern is substantially coplanar with a side surface of the interlayer insulating layer in the vertical direction on the substrate.

5 Claims, 19 Drawing Sheets

(56) References Cited

U.S. PATENT DOCUMENTS

| | | | |
|---|---|---|---|
| 2011/0228584 A1* | 9/2011 | Takemura | G11C 8/14 |
| | | | 365/72 |
| 2011/0287612 A1* | 11/2011 | Lee | H01L 27/11582 |
| | | | 438/478 |
| 2012/0098051 A1* | 4/2012 | Son | H01L 27/11582 |
| | | | 257/324 |
| 2012/0120728 A1* | 5/2012 | Kim | G11C 5/063 |
| | | | 365/185.18 |
| 2013/0200450 A1 | 8/2013 | Kusai et al. | |
| 2013/0221423 A1 | 8/2013 | Kawasaki et al. | |

\* cited by examiner

SEMICONDUCTOR DEVICES AND METHODS OF FABRICATING THE SAME

CROSS-REFERENCE TO RELATED APPLICATION

This application claims priority under 35 U.S.C. §119 to Korean Patent Application No. 10-2014-0130240 filed on Sep. 29, 2014, the disclosure of which is hereby incorporated by reference in its entirety.

BACKGROUND

In order to meet increasingly stringent requirements of high performance and cost effectiveness in the field of semiconductor memory devices, it is desirable to increase the integration level of semiconductor memory devices. In particular, the integration level of a semiconductor memory device is an important factor in determining the cost of a product. Since the integration level of a conventional two dimensional (2D) memory device is generally determined by an area occupied by a unit memory cell, it is considerably affected by micro patterning technology used to form the device. However, in order to achieve micro patterning, high-priced-equipment may be required. Accordingly, attempts to increase the integration level of the conventional 2D memory device are being made continuously. However, the results may still be unsatisfactory.

To overcome the limitations of 2D device structure, 3D semiconductor memory devices including memory cells arranged in a 3D manner have been proposed. However, for mass production of 3D semiconductor memory devices, it is required to develop the technology for achieving reliable products while reducing the cost per bit.

SUMMARY

Some embodiments of the inventive concept provide three dimensional semiconductor memory devices with improved reliability.

Some embodiments of the inventive concept provide methods of fabricating a three dimensional semiconductor memory device with improved reliability.

The technical objectives of the inventive concept are not limited to the above disclosure; other objectives may become apparent to those of ordinary skill in the art based on the following descriptions.

A three dimensional semiconductor memory device according to some embodiments of the inventive concept includes: a vertical channel structure extending in a vertical direction on a substrate; interlayer insulating layers surrounding the vertical channel structure and being stacked in the vertical direction on the substrate; gate electrodes surrounding the vertical channel structure and being disposed between the interlayer insulating layers, corners of the gate electrodes adjacent the vertical channel structure being rounded; and auxiliary gate insulating patterns disposed between the gate electrodes and the vertical channel structure, wherein a side surface of the auxiliary gate insulating pattern is substantially coplanar with a side surface of the interlayer insulating layer in the vertical direction on the substrate.

The auxiliary gate insulating patterns are vertically arranged along an outer sidewall of the vertical channel structure The gate electrodes include tungsten, titanium, tantalum, platinum and/or metal silicide.

The vertical channel structure further comprises a gate dielectric pattern, a vertical channel pattern and a filling insulating pattern.

The vertical channel pattern has a hollow cylindrical shape.

The gate dielectric pattern further comprises a blocking insulating pattern, a charge trap pattern and a tunnel insulating pattern.

A three dimensional semiconductor memory device further includes a semiconductor pattern between the vertical channel structure and the substrate.

The semiconductor pattern is in contact with the vertical channel structure and the vertical channel pattern is electrically connected to the substrate through the semiconductor pattern.

The semiconductor pattern is surrounded by the gate electrode disposed on the lowest portion.

A three dimensional semiconductor memory device in accordance with other embodiments of the inventive concept includes: gate electrodes vertically stacked on a substrate; interlayer insulating layers disposed between the gate electrodes; a vertical channel structure penetrating the gate electrodes and the interlayer insulating layers, and being electrically connected to the substrate; and auxiliary gate insulating patterns being in contact with the interlayer insulating layers, the gate electrodes and the vertical channel structure, wherein the auxiliary gate insulating patterns are disposed between the gate electrodes and the vertical channel structure and include a material having fixed charges.

The vertical channel structure further includes a gate dielectric pattern, a vertical channel and a filling insulating pattern.

The gate dielectric pattern further comprises a blocking insulating pattern, a charge trap pattern and a tunnel insulating pattern.

The auxiliary gate insulating patterns are vertically arranged along an outer sidewall of the vertical channel structure.

The auxiliary gate insulating pattern includes aluminum nitride (AlN).

Details of other embodiments are included in the detailed description and drawings.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings:

FIGS. 3 to 5 and 6A to 16A are cross-sectional views for describing methods of fabricating a three dimensional semiconductor memory device in accordance with some embodiments of the inventive concept. FIGS. 6B to 16B are enlarged views of B1 to B11 regions in FIGS. 6A to 16A, respectively;

DETAILED DESCRIPTION

Figure 1:
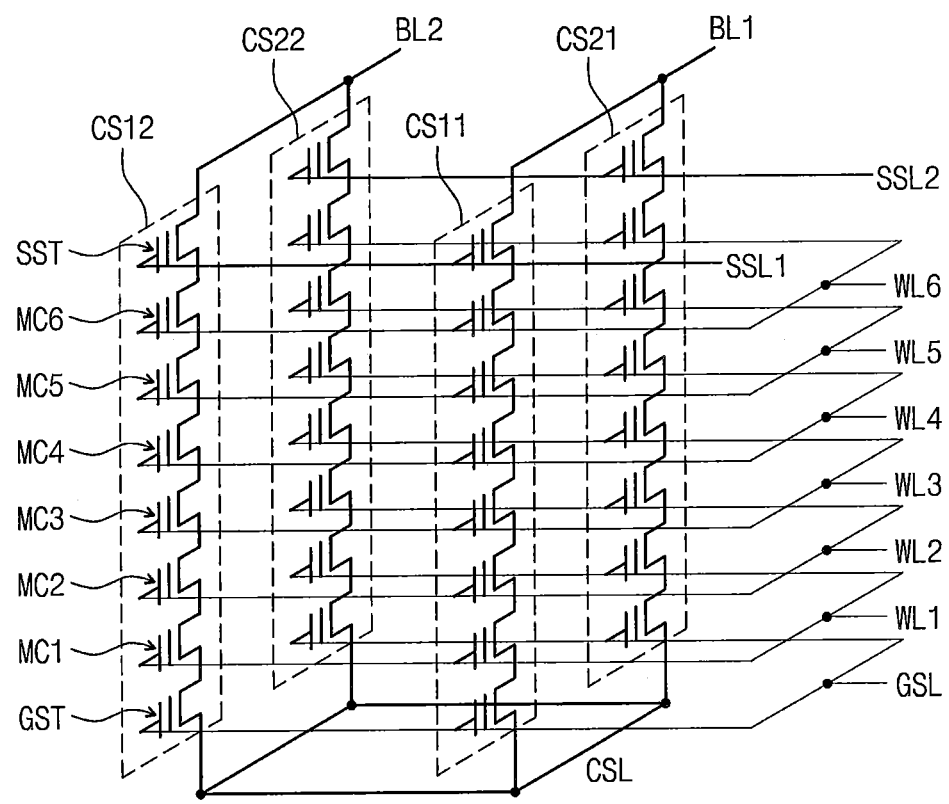
FIG. 1 is a schematic circuit diagram of a cell array of three dimensional semiconductor memory devices in accordance with some embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art.

It will be understood that when an element or layer is referred to as being "on," "connected to," or "coupled with" another element or layer, it can be directly on, connected, or coupled to the other element or layer or intervening elements or layers may be present. In contrast, when an element is referred to as being "directly on," "directly connected to," or "directly coupled with" another element or layer, there are no intervening elements or layers present. Like numerals refer to like elements throughout. As used herein, the term "and/or" includes any and all combinations of one or more of the associated listed items.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. In the following explanation, the same reference numerals denote the same components throughout the specification.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present inventive concept.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Unless the context indicates otherwise, terms such as "same," "equal," "planar," or "coplanar," as used herein when referring to orientation, layout, location, shapes, sizes, amounts or other measures do not necessarily mean an exactly identical orientation, layout, location, shape, size, amount or other measure, but are intended to encompass nearly identical orientation, layout, location, shapes, sizes, amounts or other measures within acceptable variations that may occur, for example, due to manufacturing process. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of devices may be arranged in an array and/or in a two-dimensional pattern.

FIG. 1 is a circuit diagram of a memory cell array of three dimensional semiconductor memory devices in accordance with some embodiments of the inventive concept. Referring to FIG. 1, the memory cell array may include a plurality of cell strings CS11, CS12, CS21 and CS22 extending in a vertical direction.

Each of the cell strings CS11, CS12, CS21 and CS22 may include a ground select transistor GST, a plurality of memory cell transistors MC1, MC2, and MC6 and a string select transistor SST, which are connected to each other in series. In the embodiments illustrated in FIG. 1, each of the cell strings CS11, CS12, CS21 and CS22 includes one ground select transistor GST and one string select transistor SST. In some embodiments, each of the cell strings CS11, CS12, CS21 and CS22 may includes two or more ground select transistors GSTs and string select transistors SSTs, which are connected in series. In addition, the cell strings CS11, CS12, CS21 and CS22 each having 6 memory cell transistors MC1, MC2, and MC6 are illustrated, but may have 8 or more memory cell transistors MCx.

The plurality of cell strings CS11, CS12, CS21 and CS22 may be connected in a column and row arrangement. The string select transistor SST of each of the cell strings CS11, CS12, CS21 and CS22 may be connected to corresponding bit lines BL1 and BL2. For example, the cell strings CS11 and CS21 commonly connected to the first bit line BL1 may form a first column, and the cell strings CS12 and CS22 commonly connected to the second bit line BL2 may form a second column. In addition, the string select transistor SST of each of the cell strings CS11, CS12, CS21 and CS22 may be connected to the string select lines SSL1 and SSL2. For example, the cell string CS11 and CS12 commonly connected to the first string select line SSL1 may form a first row, and the cell strings CS21 and CS22 commonly connected to the second string select line SSL2 may form a second row.

The ground select transistor GST of each of the cell strings CS11, CS12, CS21 and CS22 may be connected by the ground select line GSL. A common source line CSL may be connected to the ground select transistor GST of each of the cell strings CS11, CS12, CS21 and CS22.

The memory cell transistors MC1, MC2, and MC6 positioned at the same height may be connected to the same word lines WL1, WL2, and WL6, respectively. For example, the first memory cell transistor MC1 connected to the ground select transistor GST may be connected to the first memory cell transistor MC1 of a column adjacent thereto through the first word line WL1.

Figure 2A:
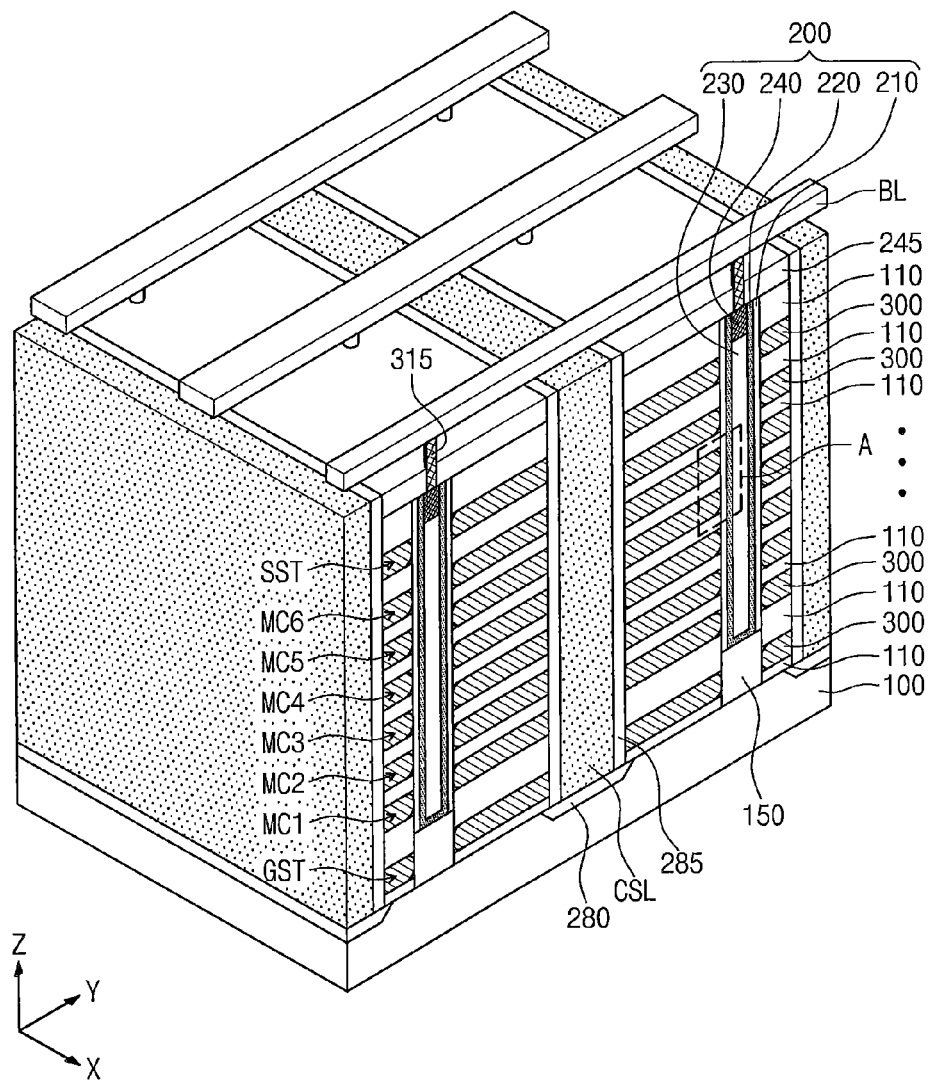
FIG. 2A is a perspective view showing a three dimensional semiconductor memory device in accordance with some embodiments of the inventive concept.
Figure 2B:
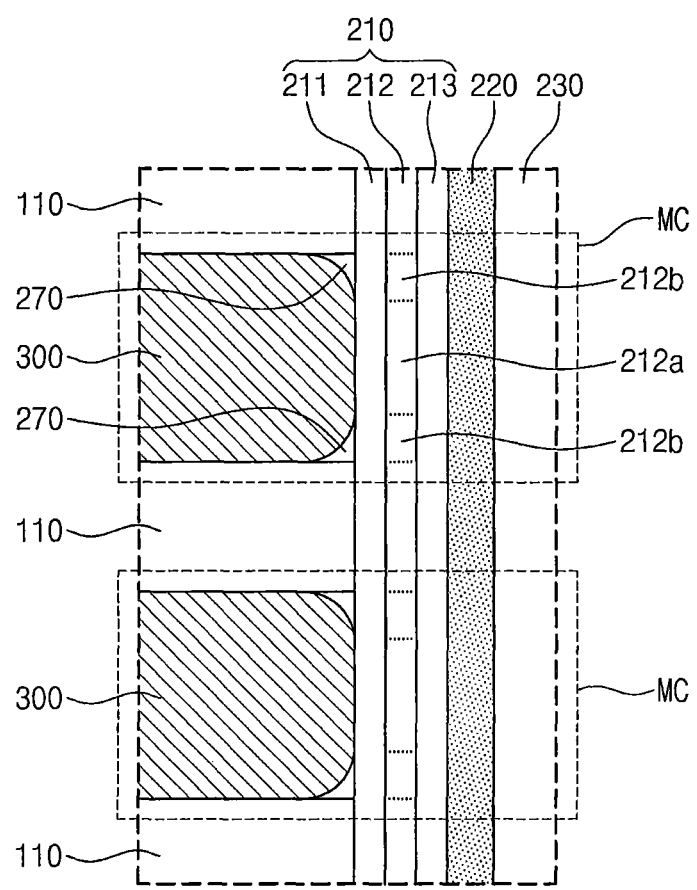
FIG. 2B is an enlarged view of A region in FIG. 2A.

FIG. 2A is a perspective view showing a three dimensional semiconductor memory device in accordance with some embodiments of the inventive concept. FIG. 2B is an enlarged view of A region in FIG. 2A.

In the figures cited in this specification, a direction substantially vertical to the top surface of the substrate is referred to as a Z direction, and two directions substantially parallel to the top surface of the substrate and crossing each other are referred to as a X direction and a Y direction. For example, the X and Y directions may be perpendicular to each other. Additionally, a direction indicated by an arrow in the figures and a reverse direction thereof are considered as the same direction.

Referring to FIGS. 2A and 2B, a three dimensional semiconductor memory device in accordance with some embodiments of the inventive concepts may include a semiconductor pattern 150, a vertical channel structure 200, gate electrodes 300 and an auxiliary gate insulating pattern 270 disposed on a substrate 100. The three dimensional semiconductor memory device may further include interlayer insulating layers 110, a common source line CSL and a common source region 280. The three dimensional semiconductor memory device may further include a first capping insulating layer 245 covering the uppermost interlayer insulating layer 110 and the vertical channel structure 200, and a second capping insulating layer (not shown) covering the common source line CSL. The three dimensional semiconductor memory device may further include a bit line contact 315 and a bit line BL.

The substrate may include a bulk silicon wafer, a germanium substrate, silicon-germanium substrate and/or silicon on insulator (SOI).

The semiconductor pattern 150 may protrude in a Z direction on the substrate 100. The semiconductor pattern 150 may include a single crystal silicon and/or a silicon-germanium compound.

The vertical channel structure 200 may penetrate the gate electrodes 300 and the interlayer insulating layers 110 in a vertical direction and thereby be in contact with the semiconductor pattern 150.

The vertical channel structure 200 may include a vertical channel pattern 220, a filling insulating pattern 230, a gate dielectric pattern 210 and a channel pad 240.

The vertical channel pattern 220 having a cylinder shape on the semiconductor 150 may protrude to extend in the Z direction. A bottom of the vertical channel pattern 220 may be in direct contact with the semiconductor pattern 150. The vertical channel pattern 220 may be electrically connected to the substrate 100 through the semiconductor pattern 150. The vertical channel pattern 220 may include a polycrystalline silicon.

The filling insulating pattern 230 may fill the inside of the vertical channel pattern 220. The filling insulating pattern 230 may include an insulating material such as silicon oxide, silicon oxynitride and/or silicon nitride.

The gate dielectric pattern 210 may include a blocking insulating pattern 211, an electric charge trap pattern 212 and a tunnel insulating pattern 213. The blocking insulating pattern 211 may be disposed on sidewalls of the interlayer insulating layers 110 and the gate electrodes, and include a oxide such as silicon oxide. The electric charge trap pattern 212 may be disposed between the blocking insulating pattern 211 and the tunnel insulating pattern 213, and include a nitride such as silicon nitride. The tunnel insulating pattern 213 may surround an outside sidewall of the vertical channel pattern 220. The tunnel insulating pattern 213 may include silicon oxide and/or silicon oxynitride.

The channel pad 240 may be disposed on the filling insulating pattern 230. The channel pad 240 may be in direct contact with an upper sidewall of the vertical channel pattern 220 and electrically connected thereto.

The gate electrodes 300 and the interlayer insulating layers 110 may surround a sidewall of the vertical channel structure 200 and extend in an X direction. The gate electrode 300 disposed on the lowest portion may surround a sidewall of the semiconductor pattern 150 and extend in the X direction. A string select transistor SST and memory cell transistors MCx may be disposed at intersections of the gate electrodes 300 and the vertical channel structure 200. The ground select transistor GST may be disposed at an intersection of the gate electrode 300 disposed on the lowest portion and the semiconductor pattern 150. The gate electrodes 300 may be electrically insulated by the interlayer insulating layers 110 from each other. The gate electrodes 300 may include at least one of the ground select gate electrodes, a plurality of cell gate electrodes and at least one of the string select gate electrodes. The ground select gate electrode may be disposed on the lowest portion and the string select gate electrode may be disposed on the uppermost portion. The memory cell gate electrodes may be stacked between the ground select gate electrode and the string select gate electrode. The memory cell gate electrodes may substantially have the same thickness. The ground select gate electrode and the string select gate electrode may have a thickness that is different than the thickness of the memory cell gate electrodes. For example, the ground select gate electrode and the string select gate electrode may be thicker than the memory cell gate electrodes. According to some embodiments, the plurality of memory cell gate electrodes may serve as the world lines (WL1, WL2, . . . , and WL6 of FIG. 1). The ground select gate electrode may serve as the ground select line (GSL of FIG. 1) and the string select gate electrode may serves as the string select lines (SSL1 and SSL2 of FIG. 1). The gate electrodes 300 may include a barrier metal layer. The barrier metal layer may include a metal nitride material such as titanium, titanium nitride, tantalum and/or tantalum nitride. The gate electrodes 300 may include a conductive material such as tungsten, titanium, tantalum, platinum and/or a metal silicide.

Corners of the gate electrodes 300 adjacent the blocking insulating pattern 211 or the semiconductor pattern 150 may be rounded to have a curved surface. An auxiliary gate insulating pattern 270 may be disposed between the rounded corner of gate electrode 300 and the vertical channel structure 200. In addition, the auxiliary gate insulating pattern 270 may be disposed between the rounded corner of gate electrode 300 and the semiconductor pattern 150. The auxiliary gate insulating pattern 270 may surround the vertical channel structure 200 or the semiconductor pattern 150. The auxiliary gate insulating patterns 270 may be vertically arranged along the outer sidewall of the vertical channel structure 200.

As shown in FIGS. 2A and 2B, the interlayer insulating layer 110 may be disposed on one side surface of the auxiliary gate insulating pattern 270 and the blocking insulating pattern 211 may be disposed on the other side surface of the auxiliary gate insulating pattern 270. The side surface of the auxiliary gate insulating pattern 270 in contact with the blocking insulating pattern 211 may be substantially coplanar with side surfaces of the interlayer insulating layers 110 in the vertical direction on the substrate 100.

The auxiliary gate insulating pattern 270 may be rounded to have a curved surface at a portion in contact with the gate electrode 300. Therefore, the corner of the gate electrode 300 may be rounded by the auxiliary gate insulating pattern 270. The auxiliary gate insulating pattern 270 may include aluminum nitride (AlN).

The interlayer insulating layers 110 and the gate electrodes 300 may be alternately stacked. The interlayer insulating layer 110 disposed the lowest portion may have a thickness thinner than other interlayer insulating layers 110. The interlayer insulating layers 110 may include an insulating material such as silicon oxide.

The common source line CSL may disposed between the vertical channel structures and vertically penetrate the gate electrodes 300 and the interlayer insulating layers 110. The common source line CSL may be in contact with the substrate 100. The common source line CSL may extend along the X direction. A trench spacer 285 may disposed between the common source line CSL and the gate electrodes 300 and the common source line CSL may be electrically insulated from gate electrodes 300 by the trench spacer 285.

The common source region 280 may be formed in the substrate 100 to align with the common source line CSL. The common source region 280 may include N-type impurity such as phosphors or arsenic injected into the substrate 100.

The first capping insulating layer 245 may disposed on the vertical channel pattern 220 and the channel pad 240. The first capping insulating layer 245 may include silicon oxide.

The second capping insulating layer (not shown) may disposed on the common source line CSL and the first capping insulating layer 245. The second capping insulating layer may include silicon oxide.

The bit line contact 315 may be in contact with the channel pad 240 through the first capping insulating layer 245 and the second capping insulating layer. The bit line contact 315 may include a conductor such as silicon, metal silicide, and/or metal.

The bit line BL may disposed on the second capping insulating layer to extend in a Y direction. The bit line BL may be electrically connected to the vertical channel pattern 220 through the bit line contact 315 and the channel pad 240. The bit line BL may include a metal such as tungsten and/or copper.

Referring again to FIG. 2A and FIG. 2B, electrical characteristics of the three dimensional semiconductor memory device in accordance with some embodiments of inventive concepts will be described.

A Program operation may be performed in a specific memory cell MC of the three dimensional semiconductor memory device in accordance with some embodiments of the inventive concepts and the memory cell MC may be programmed. Charges (e.g., electrons) may be stored in a first region 212a of the memory cell MC. The first region 212a may be defined as a region where the gate electrode 300 and the charge trap pattern 212 are overlapped. The charge trap pattern 212 may continuously extend in the Z direction on the substrate 100. A plurality of memory cells MC may be vertically disposed along the charge trap pattern 212. The charges (e.g., electrons) stored in the first region 212a of the memory cell MC may spread in the Z direction between adjacent memory cells MC. In this case, data of the programmed memory cell MC may be damaged.

However, migration of the charges stored in the first region 212a may be suppressed by the auxiliary gate insulating pattern 270 in accordance with some embodiments of the inventive concepts. The auxiliary gate insulating pattern 270 may be formed of a material that has an intrinsic negative charge, or fixed negative charge. In this manner, the auxiliary gate insulating patterns 270 may operate to repel any negative charge present in the first region 212a of the charge trap pattern 212. The negative charge present in the auxiliary gate insulating patterns 270 may operate as a potential barrier to retains electrons present in the first region 212a by operation of a repulsive force, or interaction, between the negative charge and the electrons. The auxiliary gate insulating patterns 270 may operate to limit migration of the electrons in the Z direction of the charge trap pattern 212 between neighboring memory cells MC. The potential barrier may be formed in a second region 212b where the auxiliary gate insulating pattern 270 and the charge trap pattern 212 are overlapped. As a result, retention of data may be improved along with device reliability. In addition, the corner of the gate electrode 300 may be rounded to have the curved surface by the auxiliary gate insulating pattern 270. Accordingly, the gate electrode 300 having the rounded corner may suppress a electric field concentrated at the corner of the gate electrode 300.

FIGS. 3 to 5 and 6A to 16A are cross-sectional views for describing methods of fabricating a three dimensional semiconductor memory device in accordance with some embodiments of the inventive concept. FIGS. 6B to 16B are enlarged views of B1 to B11 regions in FIGS. 6A to 16A, respectively.

Figure 3:
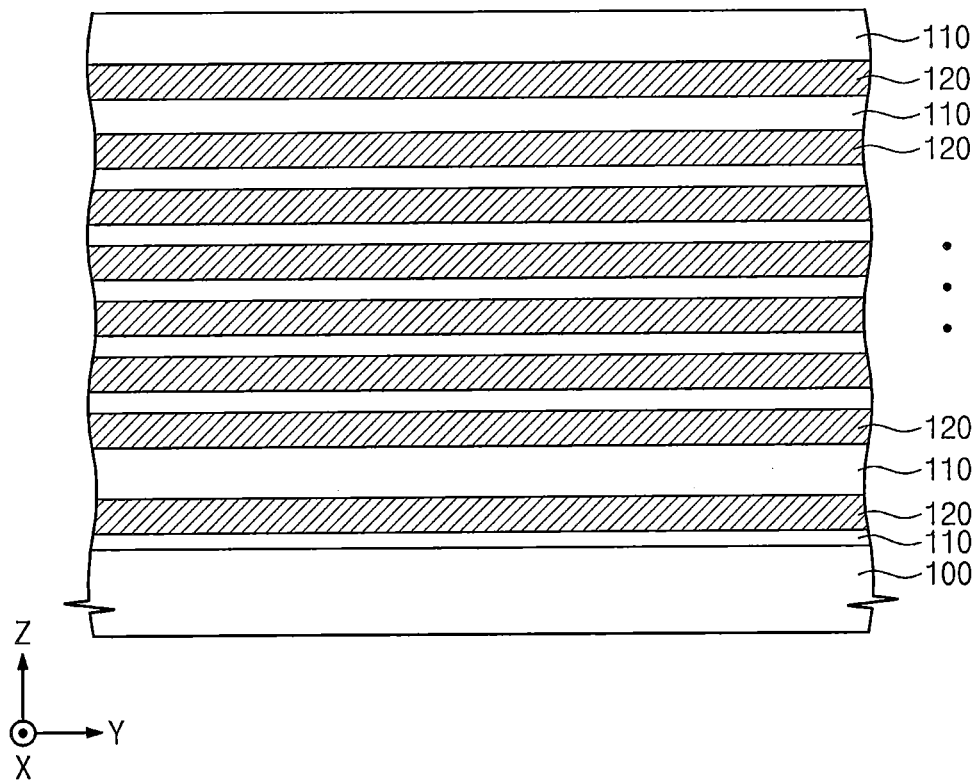

Referring to FIG. 3, methods of fabricating a three dimensional semiconductor memory device may include alternately and repeatedly stacking an interlayer insulating layer 110 and a sacrificial layer 120 on a substrate 100. Thus a plurality of interlayer insulating layers 110 and a plurality of sacrificial layers 120 may be alternately stacked on the substrate 100 in a Z direction. The substrate 100 may include a semiconductor material such as silicon, germanium, etc.

The interlayer insulating layers 110 may have different thicknesses. For example, the interlayer insulating layer 110 disposed on the lowest portion may have a thickness thinner than other interlayer insulating layers 110. The interlayer insulating layer 110 may include an insulating material such as silicon oxide.

The sacrificial layers 120 may include a material having a etch selectivity from the interlayer insulating layer 110. For example, the sacrificial layers 120 may include an insulating material such as silicon nitride.

Figure 4:
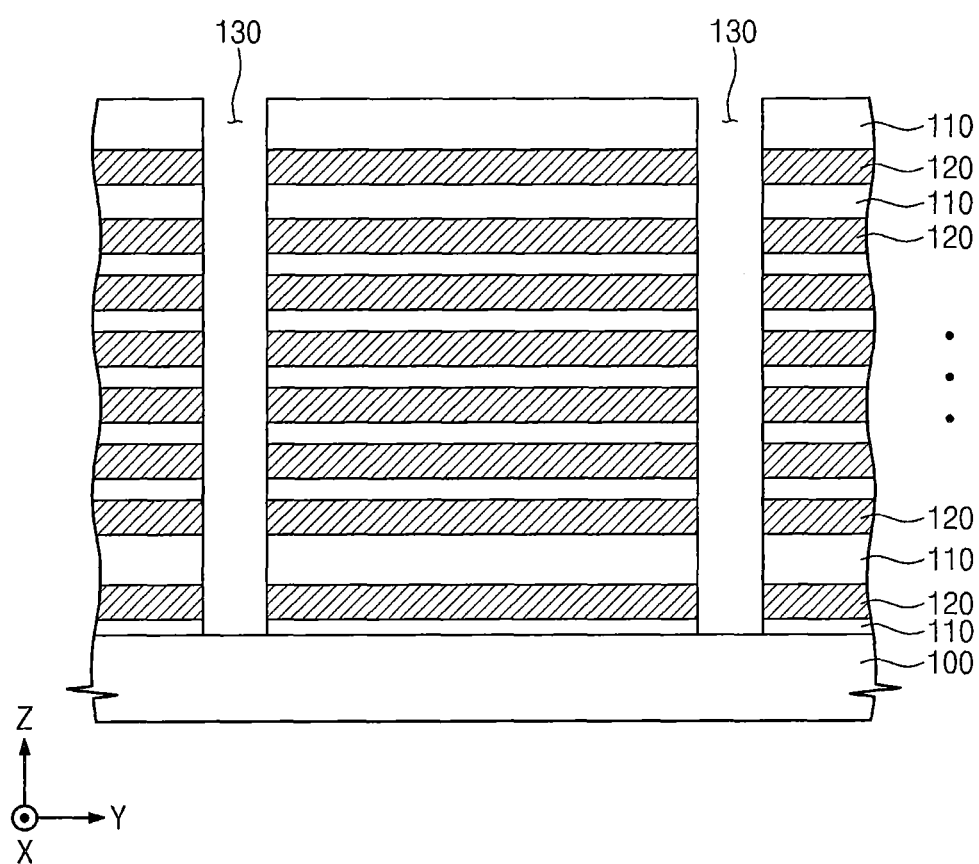

Referring to FIG. 4, channel holes 130 may be formed to expose the substrate 100 through the interlayer insulating layers 110 and the sacrificial layers 120. For example, forming the channel holes 130 may include forming a mask pattern (not shown) on the uppermost interlayer insulating layer 110, and sequentially anisotropic etching the interlayer insulating layers 110 and the sacrificial layers 120 using the mask pattern as an etch mask until an upper surface of the substrate 100 is exposed. Through the anisotropic etching, the surface of the substrate 100 in the channel hole 130 may be over-etched to be recessed to a predetermined depth. The channel holes 130 may be in forms of holes.

Referring to FIG. 4 together with FIG. 2A, the channel holes 130 may be formed in a zigzag configuration in an X direction.

Figure 5:
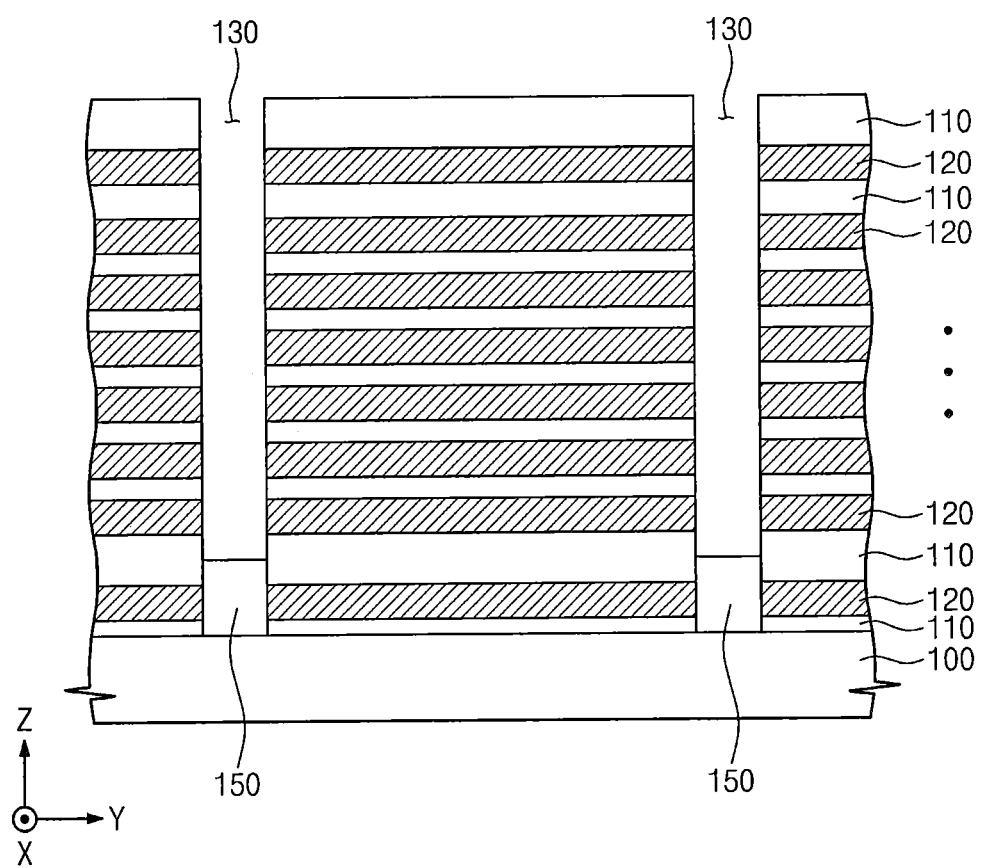

Referring to FIG. 5, a semiconductor pattern 150 partially filling a lower portion of the channel hole 130 may be formed. For example, the semiconductor pattern 150 partially filling a bottom surface of the channel hole 130 may be formed by performing a selective epitaxial growth (SEG) process using an upper surface of the substrate 100 as a seed exposed by the channel holes 130. The semiconductor pattern 150 may include single crystalline silicon and/or single crystalline silicon-germanium and include doped impurity ion in some cases. An upper surface of the semiconductor pattern 150 may be located at a higher level than an upper surface of the lowest sacrificial layer 120.

Figure 6A:
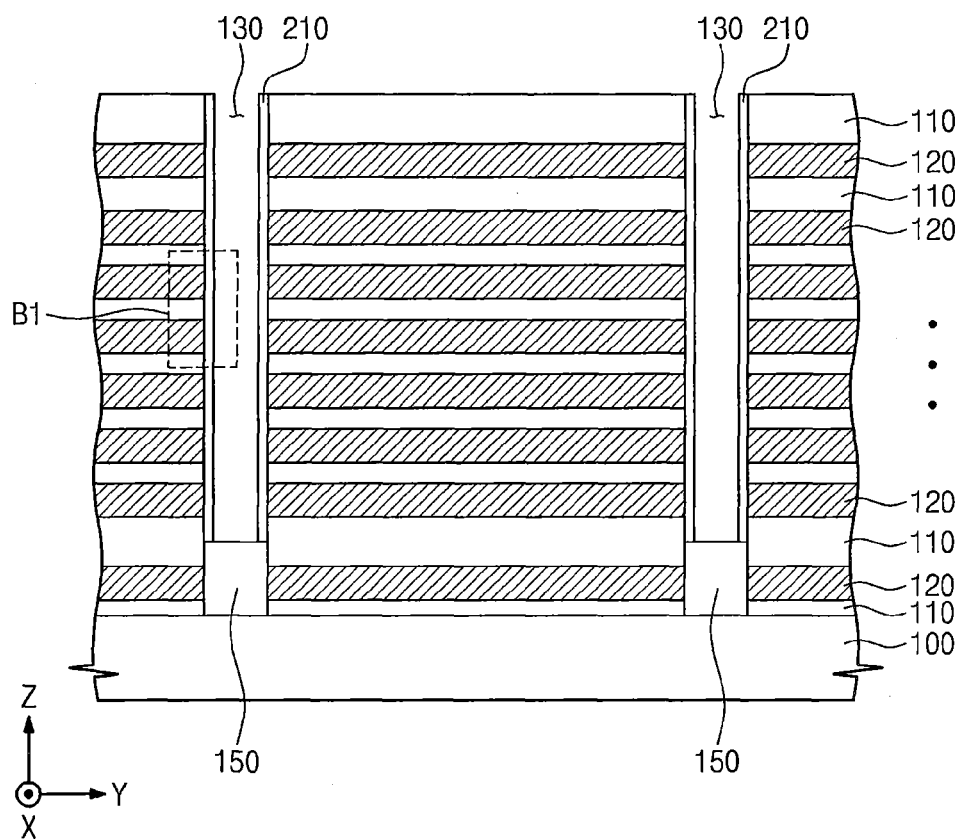
Figure 6B:
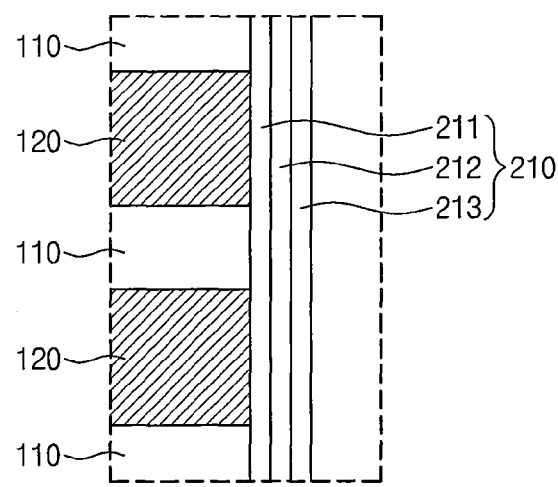

Referring to FIGS. 6A and 6B, a gate dielectric pattern 210 may be formed on a sidewall of the channel hole 130. The forming of the gate dielectric pattern 210 may include sequentially forming a blocking insulating layer, a charge trap layer and a tunnel insulating layer on the sidewall of the channel hole 130 on the uppermost interlayer insulating layer 110 and the semiconductor pattern 150, and exposing an upper surface of the uppermost interlayer insulating layer 110 and the upper surface of the semiconductor pattern 150 by anisotropically etching the blocking layer, the charge trap layer and the tunnel insulating layer. The gate dielectric pattern 210 may be formed as a spacer shape on the sidewall of the channel hole 130 by performing the etching process. The exposed upper surface of the semiconductor pattern 150 may be recessed by over-etching. The gate dielectric pattern 210 may be formed as a pipe shape in the channel hole 130. The gate dielectric pattern 210 may include the blocking insulating pattern 211, the charge trap pattern 212 and the tunnel insulating pattern 213. The blocking insulating pattern 211, the charge trap pattern 212 and the tunnel insulating pattern may be sequentially formed on the sidewall of the channel hole 130.

The blocking insulating pattern 211 may include silicon oxide formed by a chemical vapor deposition process. The charge trap pattern 212 may include a nitride material such as silicon nitride formed by the chemical vapor deposition process. The tunnel insulating pattern 213 may include silicon oxide and/or silicon nitride formed by the chemical vapor deposition process.

Figure 7A:
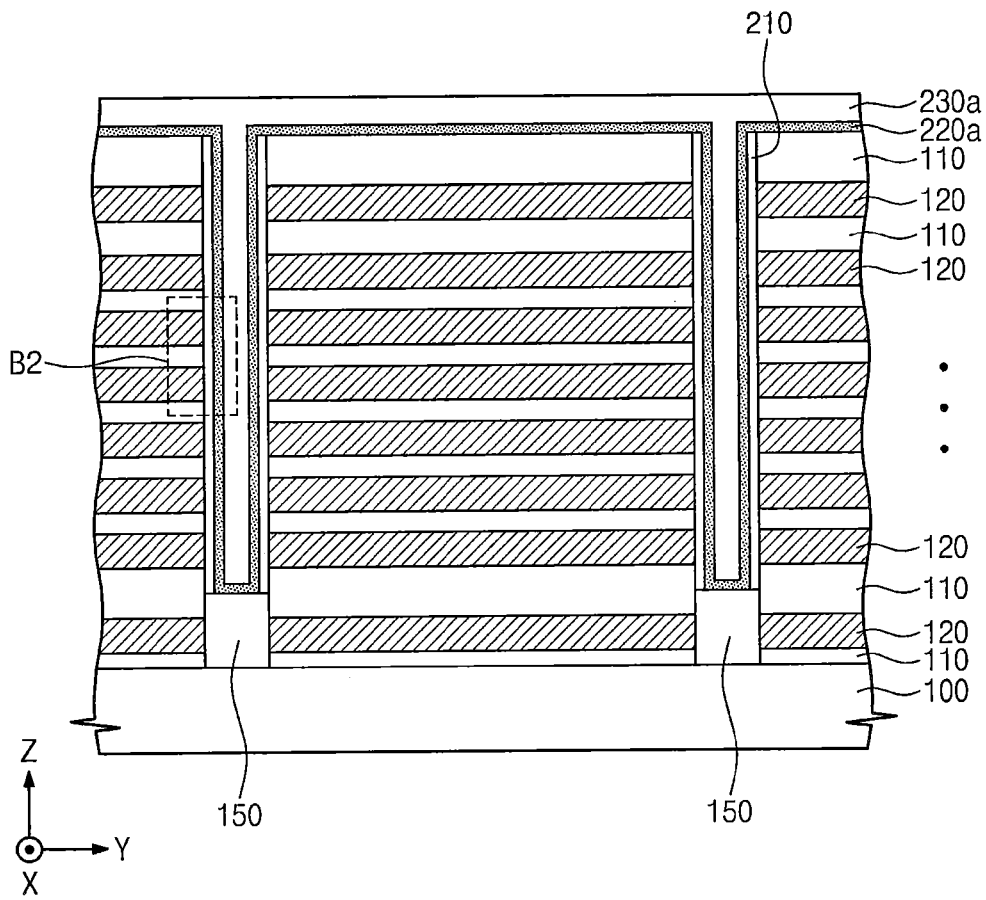
Figure 7B:
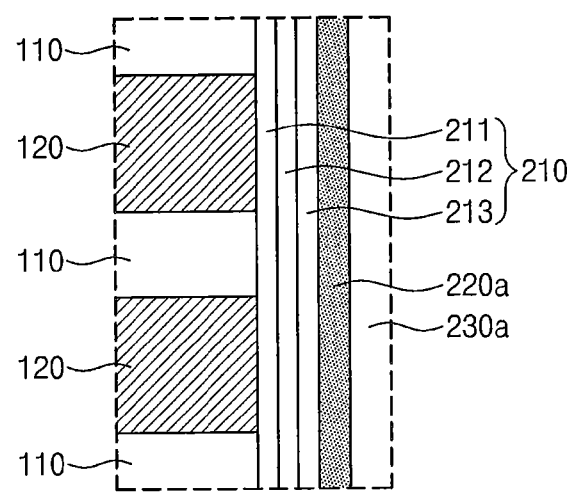

Referring to FIGS. 7A and 7B, a vertical channel layer 220a and a filling insulating layer 230a may be formed in the channel hole 130. The vertical channel layer 220a may be formed on the uppermost interlayer insulating layer 110, the tunnel insulating pattern 213 and the exposed semiconductor pattern 150. The vertical channel layer 220a may be in direct contact with the upper surface of the semiconductor pattern 150 and electrically connected to the substrate 100. The vertical channel layer 220a may include polycrystalline silicon. The filling insulating layer 230a may be formed on the vertical channel layer 220a to fully fill the inside of the channel hole 130. The filling insulating layer 230a may include silicon oxide.

Figure 8A:
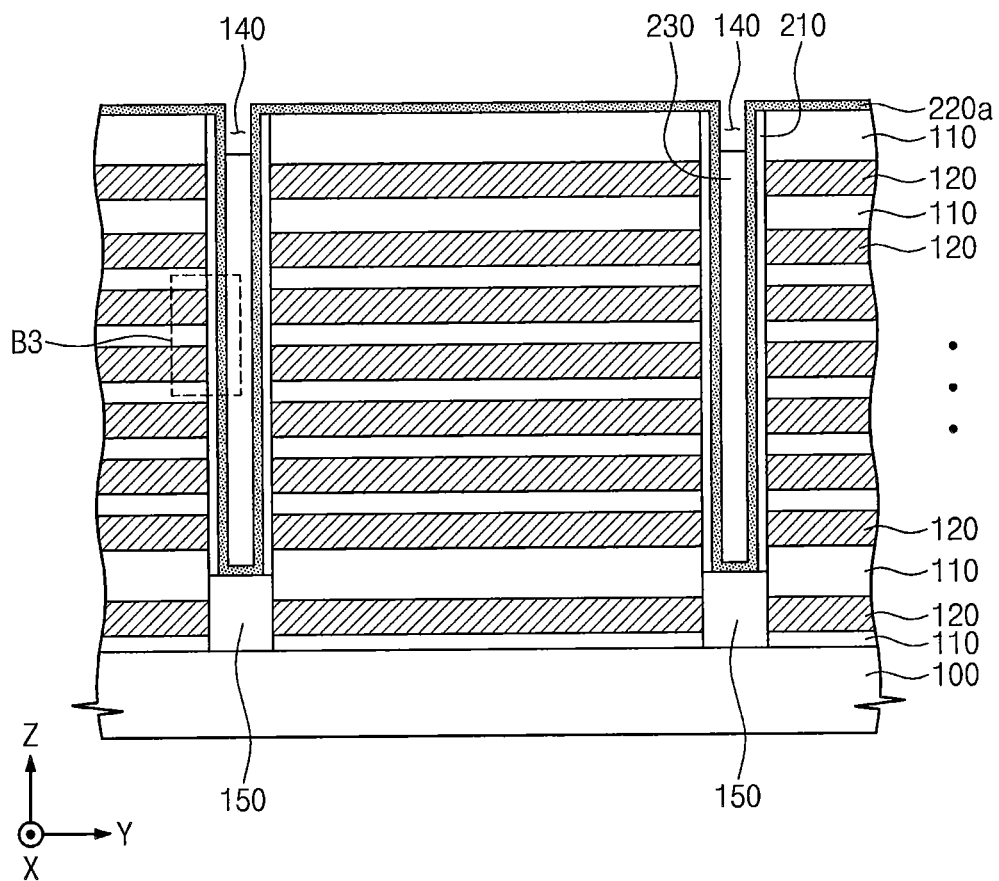
Figure 8B:
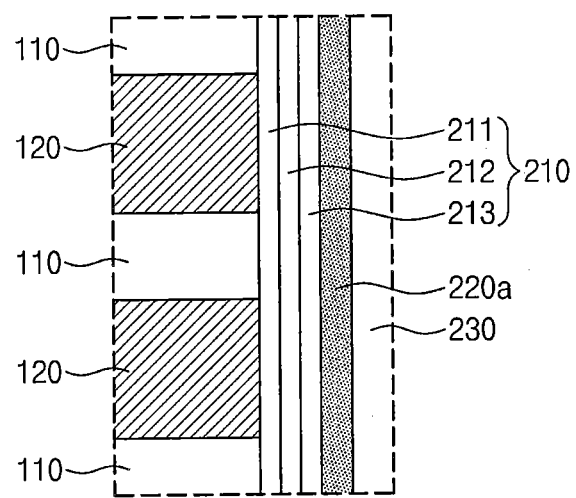

Referring to FIGS. 8A and 8B, a filling insulating pattern 230 having a pad recess 140 may be formed by performing an etch-back process on the filling insulating layer 230a. The vertical channel layer 220a may be exposed on the uppermost interlayer insulating layer 110.

Figure 9A:
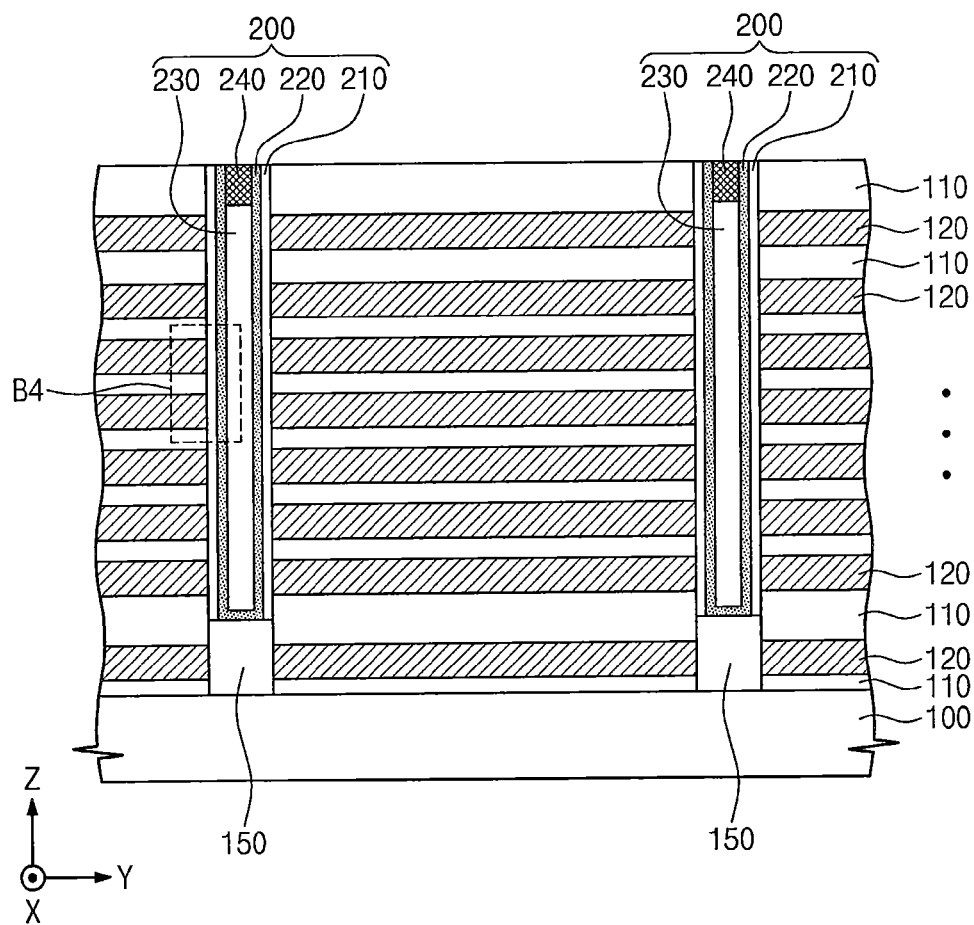
Figure 9B:
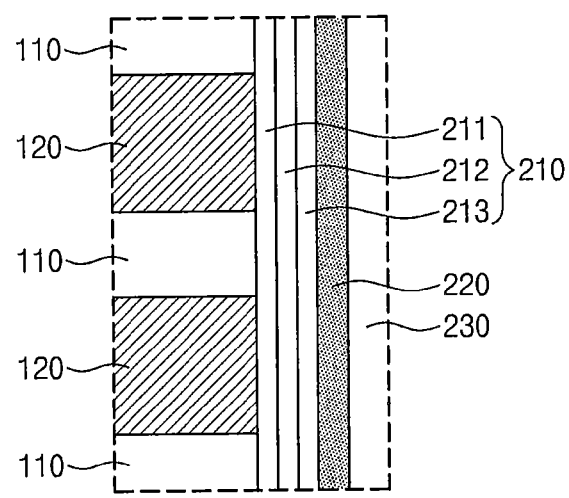

Referring to FIGS. 9A and 9B, a pad material may be filled in the pad recess 140 and a vertical channel pattern 220 and a channel pad 240 may be formed by performing a chemical mechanical polishing process. A structure in which the blocking insulating pattern 211, the charge trap pattern 212, the tunnel insulating pattern 213, the vertical channel pattern 220 and the filling insulating pattern 230 are sequentially stacked may be formed on the sidewall of the channel hole 130. A vertical channel structure 200 including the blocking insulating pattern 211, the charge trap pattern 212, the tunnel insulating pattern 213, the vertical channel pattern 220, the filling insulating pattern 230 and the channel pad 240 may be formed by this process. The channel pad 240 may include a conductive material such as polycrystalline silicon doped with impurities.

Figure 10A:
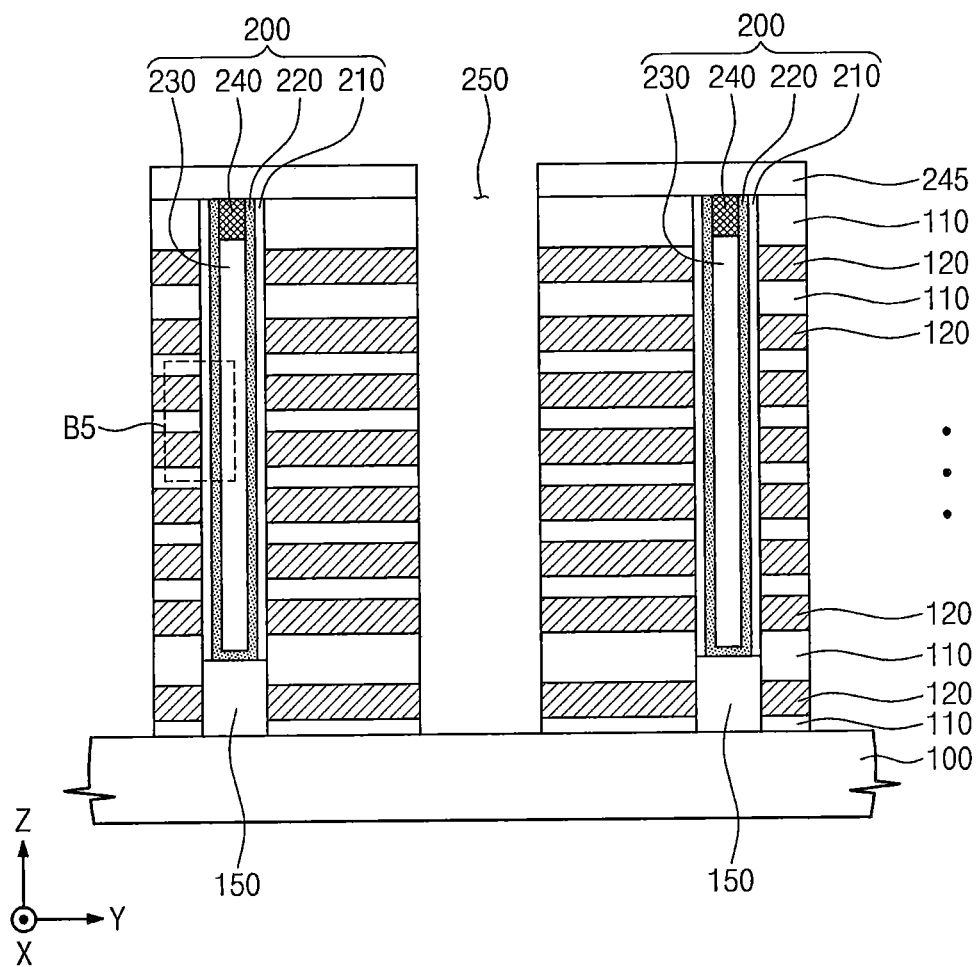
Figure 10B:
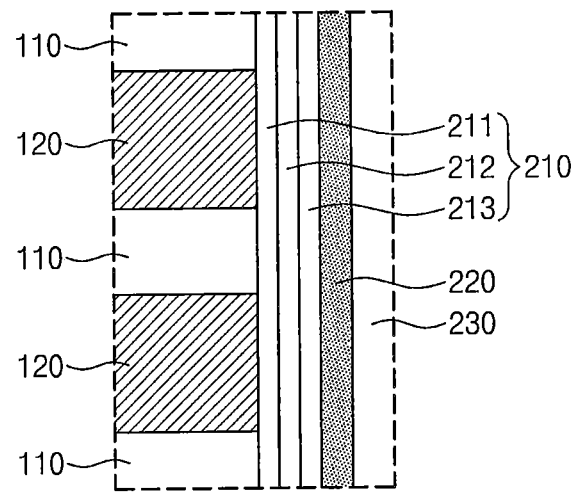

Referring to FIGS. 10A and 10B, a first capping insulating layer 245 may be formed, and a trench 250 may be formed by anisotropically etching the first capping insulating layer 245 and the interlayer insulating layers 110 between the adjacent vertical channel structures 200. The trench 250 may expose the substrate 100 through the interlayer insulating layers 110 and the sacrificial layers 120 in a vertical manner. The trench 250 may extend along an X direction. Side surfaces of the interlayer insulating layers 110 and the sacrificial layers 120 may be exposed on a sidewall of the trench 250.

Figure 11A:
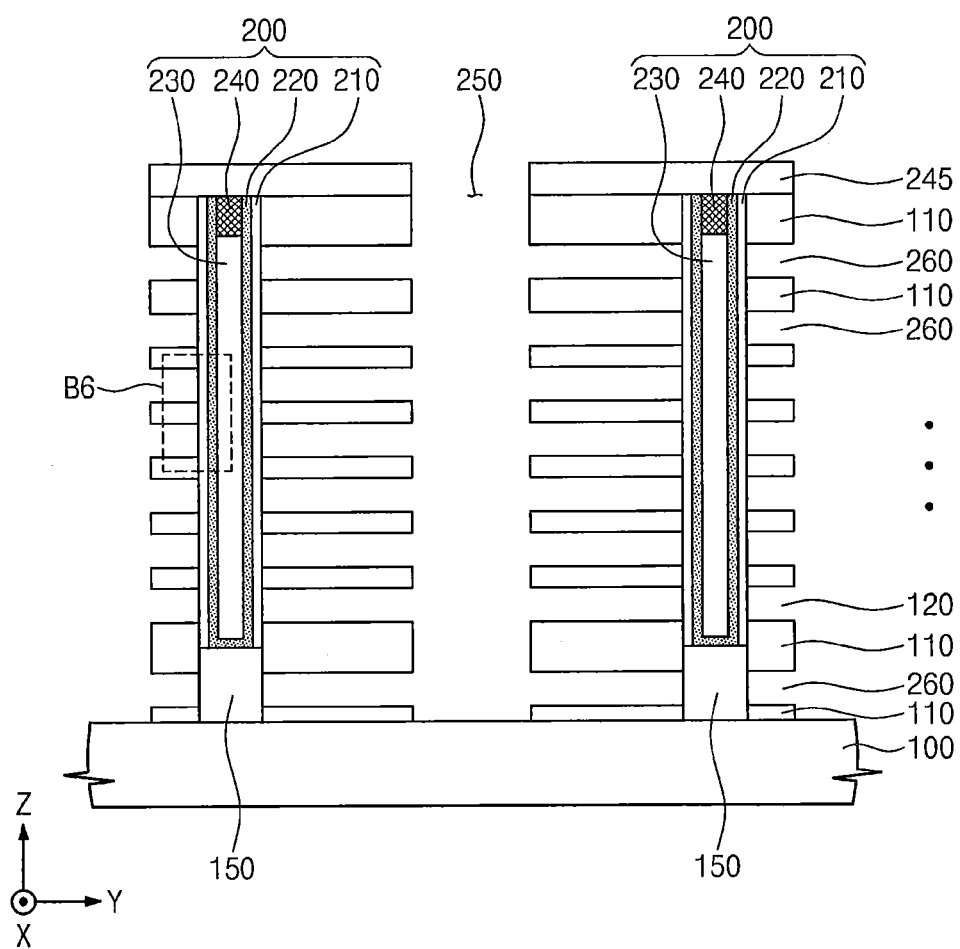
Figure 11B:
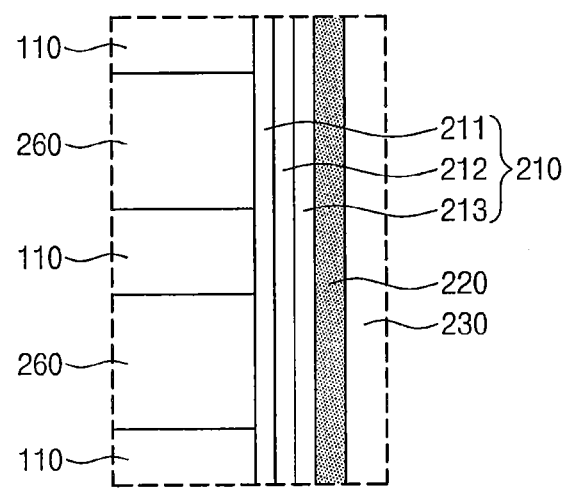

Referring to FIGS. 11A and 11B, the sacrificial layers 120 exposed on the sidewall of the trench 250 may be removed and gaps 260 between the interlayer insulating layers 110 may be formed. The blocking insulating pattern 211, a portion of a sidewall of the semiconductor pattern 150 and a portion of an upper surface of the substrate 100 may be exposed by the gaps 260.

Removing the sacrificial layers 120 may include performing a wet etch process using an etchant having a higher etch selectivity than the interlayer insulating layers 110. When the interlayer insulating layer 110 and the sacrificial layer 120 include a silicon oxide layer and a silicon nitride layer, respectively, the etchant may include phosphoric acid ($H_3PO_4$).

Figure 12A:
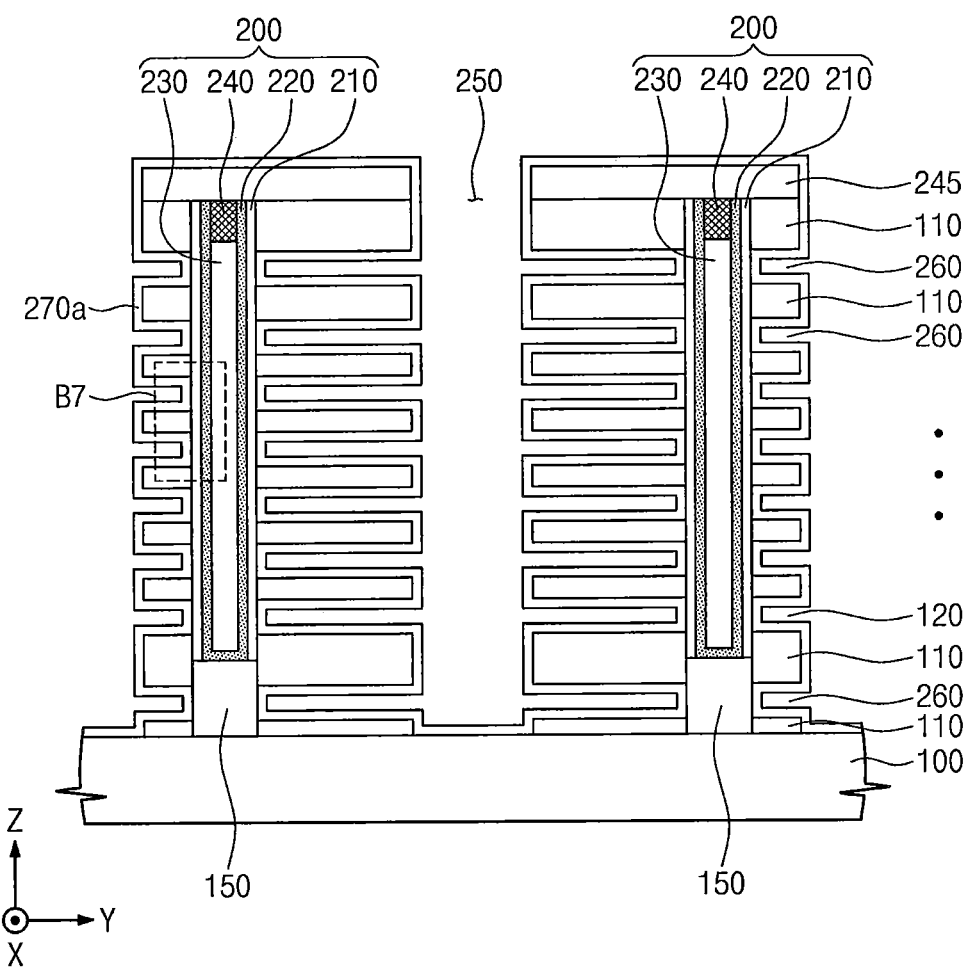
Figure 12B:
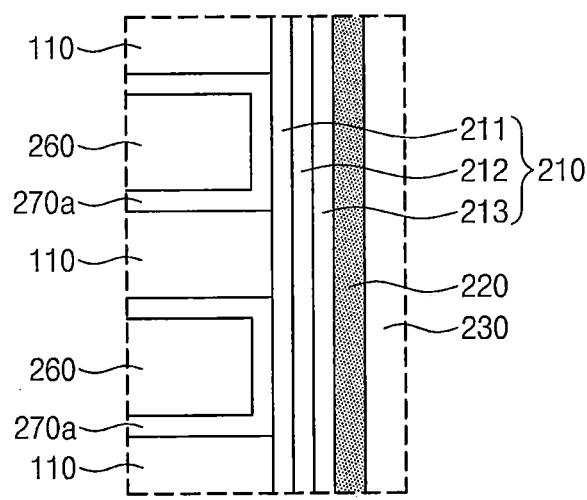

Referring to FIGS. 12A and 12B, a auxiliary gate insulating layer 270a may be conformally formed on an inner wall of the gap 260, the side surface of the interlayer insulating layer 110, the exposed substrate 100 and the first capping insulating layer 245. The auxiliary gate insulating layer 270a may include a insulating material having positive or negative fixed charges. For example, the auxiliary gate insulating layer 270a may include a aluminum nitride layer (AlN) having the negative fixed charges.

Figure 13A:
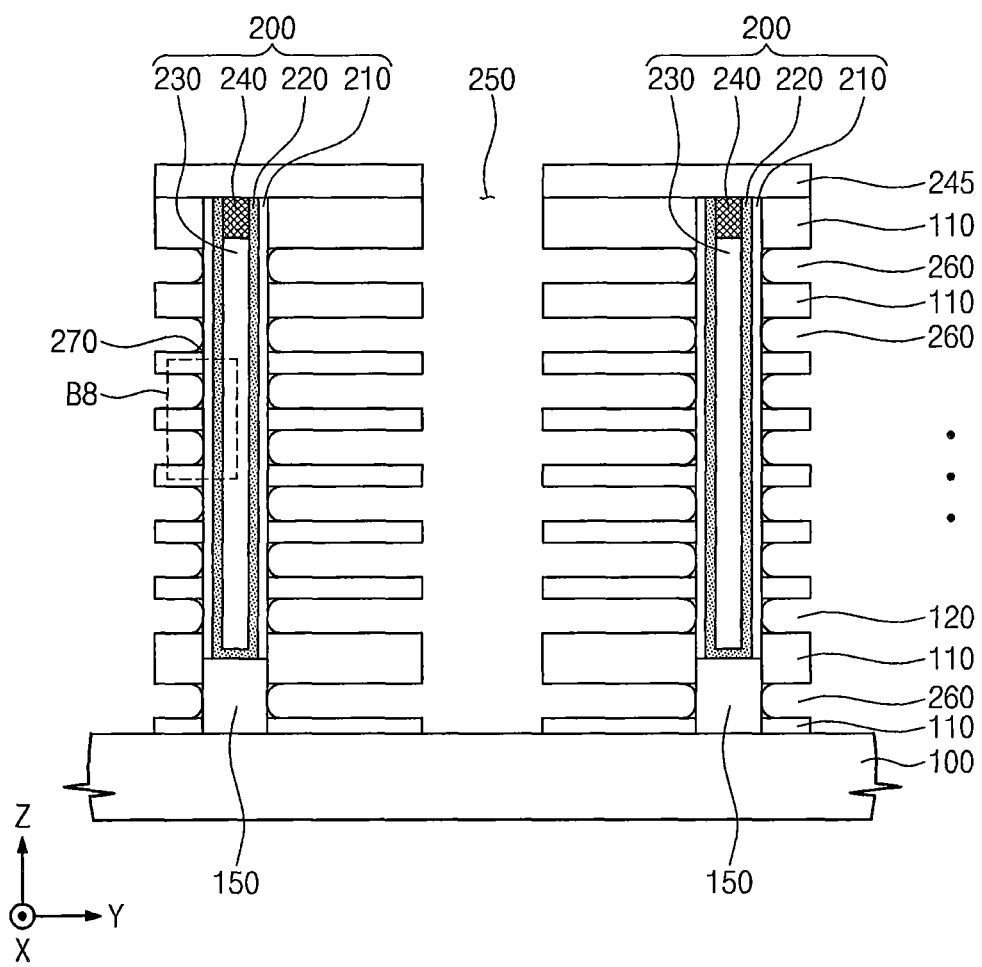
Figure 13B:
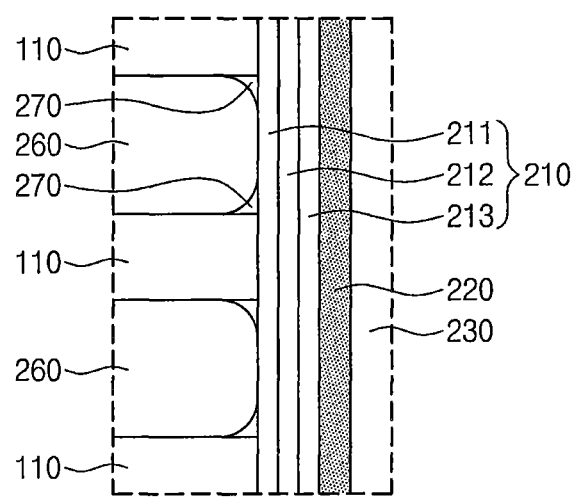

Referring to FIGS. 13A and 13B, the auxiliary gate insulating patterns 270 in contact with the gate dielectric pattern 210 and the interlayer insulating layers 110 may be formed in the gaps 260. Forming the auxiliary gate insulating patterns 270 may include partially removing the auxiliary gate insulating layer 270a having etch selectivity with respect to the blocking insulating pattern 211 and the interlayer insulating layer 110. When the auxiliary gate insulating layer 270a is removed by a wet etch process, a portion of the auxiliary gate insulating layer 270a may be remained on a corner region of the gap 260 by an isotropic etch. Surfaces of the auxiliary gate insulating patterns 270 exposed in the gap 260 may be rounded to have a curved surface. When the blocking insulating pattern 211 and the interlayer insulating layer 110 are silicon oxide layers and the auxiliary gate insulating layer 270a include a aluminum nitride layer (AlN), an etchant may include a mixture that is mixed with phosphoric acid, acetic acid, nitric acid and/or de-ionized water.

Figure 14A:
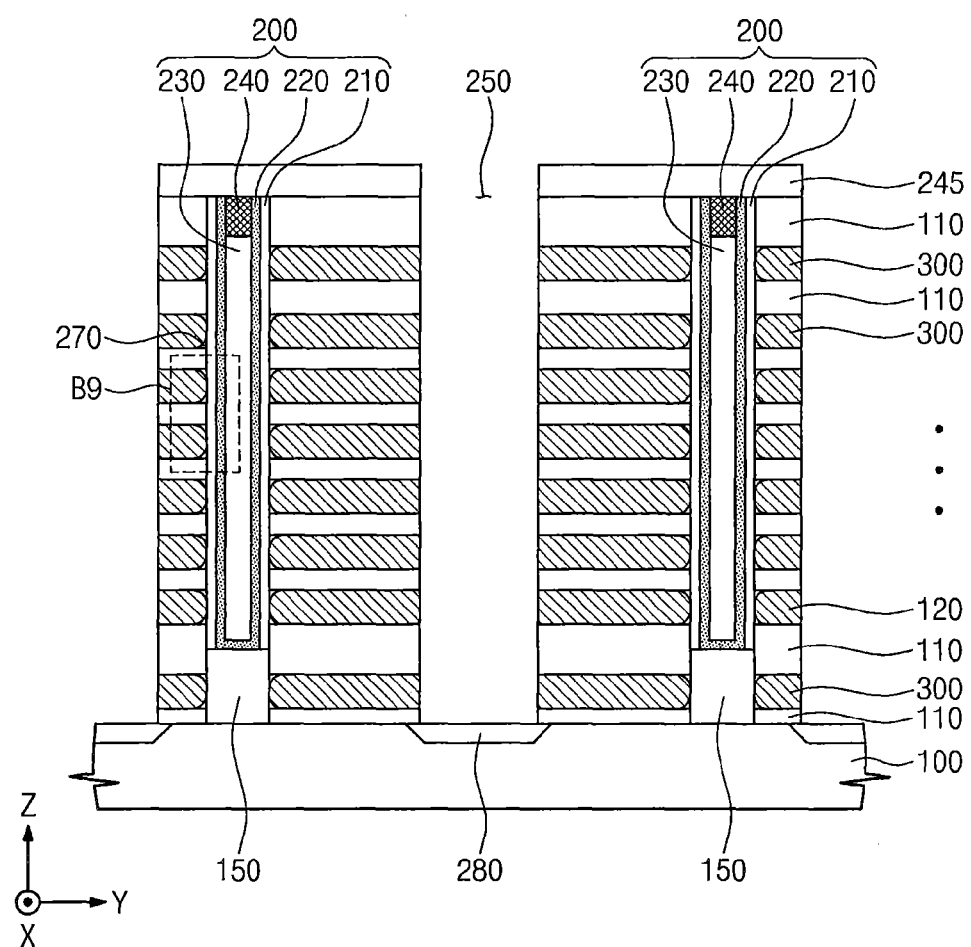
Figure 14B:
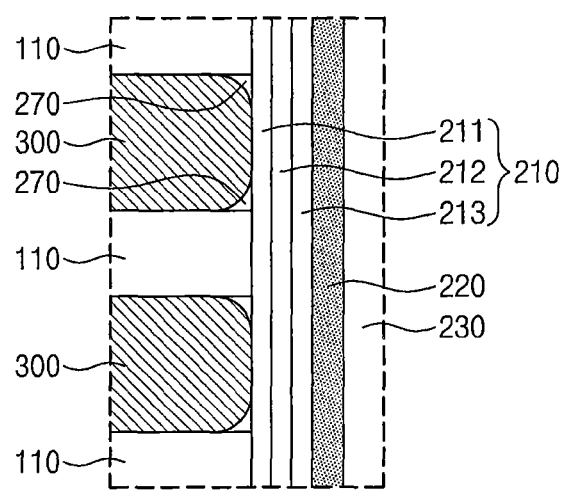

Referring to FIGS. 14A and 14B, gate electrodes 300 may be formed by fully filling a metal material in the gaps 260. The gate electrode 300 may be in contact with the auxiliary gate insulating pattern 270, the blocking insulating pattern 211 and the interlayer insulating layer 110. The gate electrode 300 may be rounded to have a curved surface at a portion in contact with the surface of the auxiliary gate insulating pattern 270. Thus, corners of gate electrode 300 may have a curved surface. The gate electrode 300 may further include a barrier metal layer formed on the inner wall of the gap 260. The barrier metal layer may include a metal nitride such as titanium, titanium nitride, tantalum and/or tantalum nitride. The gate electrode 300 may include the metal material such as tungsten, titanium, tantalum, platinum and/or a metal silicide.

Thereafter, impurities may be injected into the substrate 100 exposed in the trench 250. Thus, a common source region 280 extending in an X direction along the trench 250 may be formed. The impurities may include N-type impurities such as phosphors and/or arsenic.

Figure 15A:
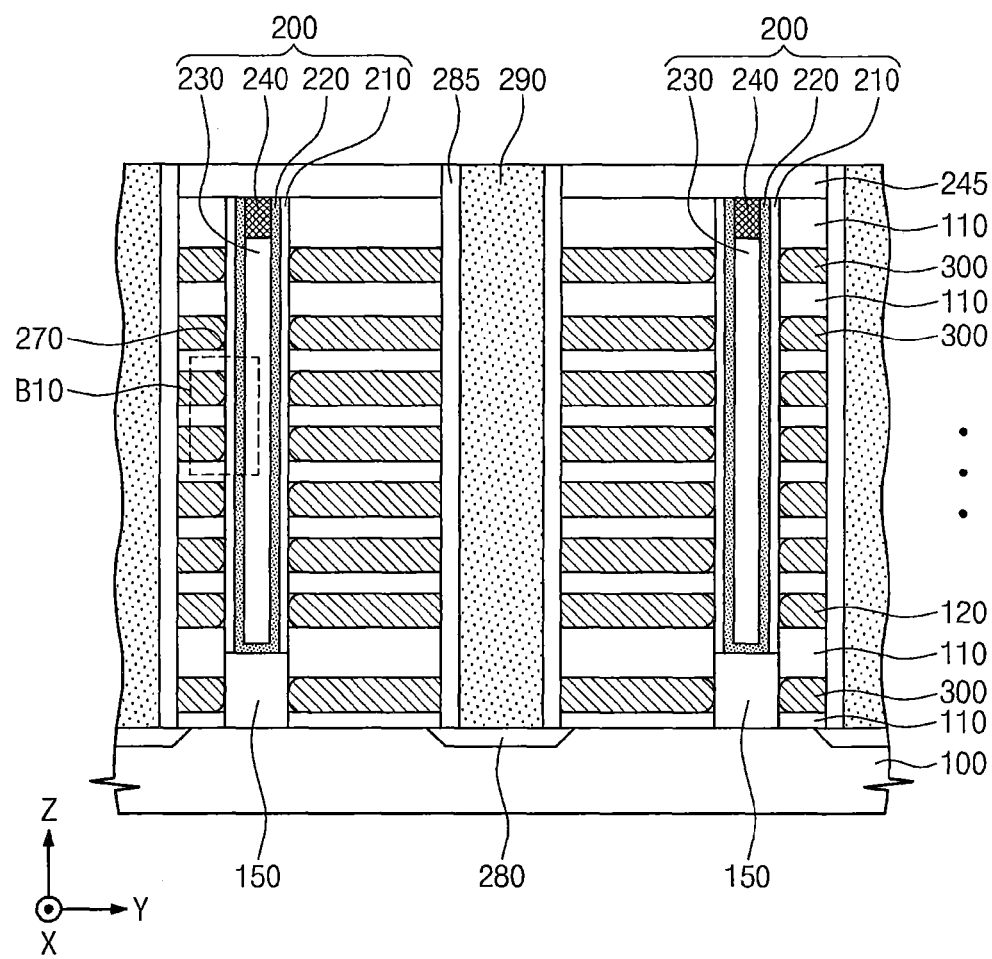
Figure 15B:
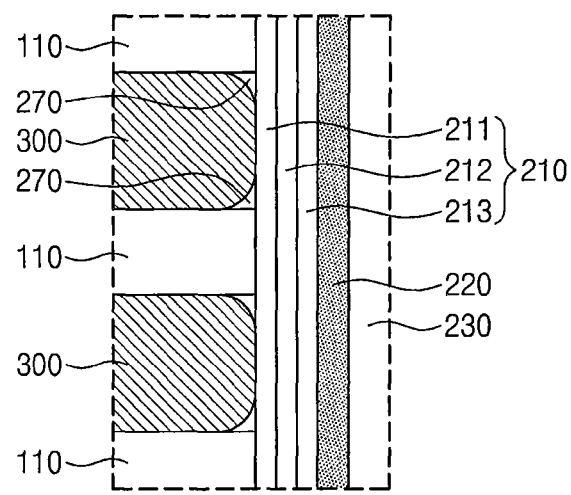

Referring to FIGS. 15A and FIG. 15B, a trench spacer 285 may be formed on the side wall of the trench 250. Thereafter, a common source line 290 filling in the trench 250 may be formed on the trench spacer 285 to extend in an X direction. The common source line 290 may be in direct contact with the common source region 280. Thus, the common source line 290 may be electrically connected to the common source region 280. The trench spacer 285 may electrically insulate the gate electrode 300 from the common source line 290. The trench spacer 285 may include an insulating material such as silicon oxide and/or silicon nitride. The common source line 290 may include a metal layer such as tungsten, titanium, tantalum, platinum and/or a metal silicide.

Figure 16A:
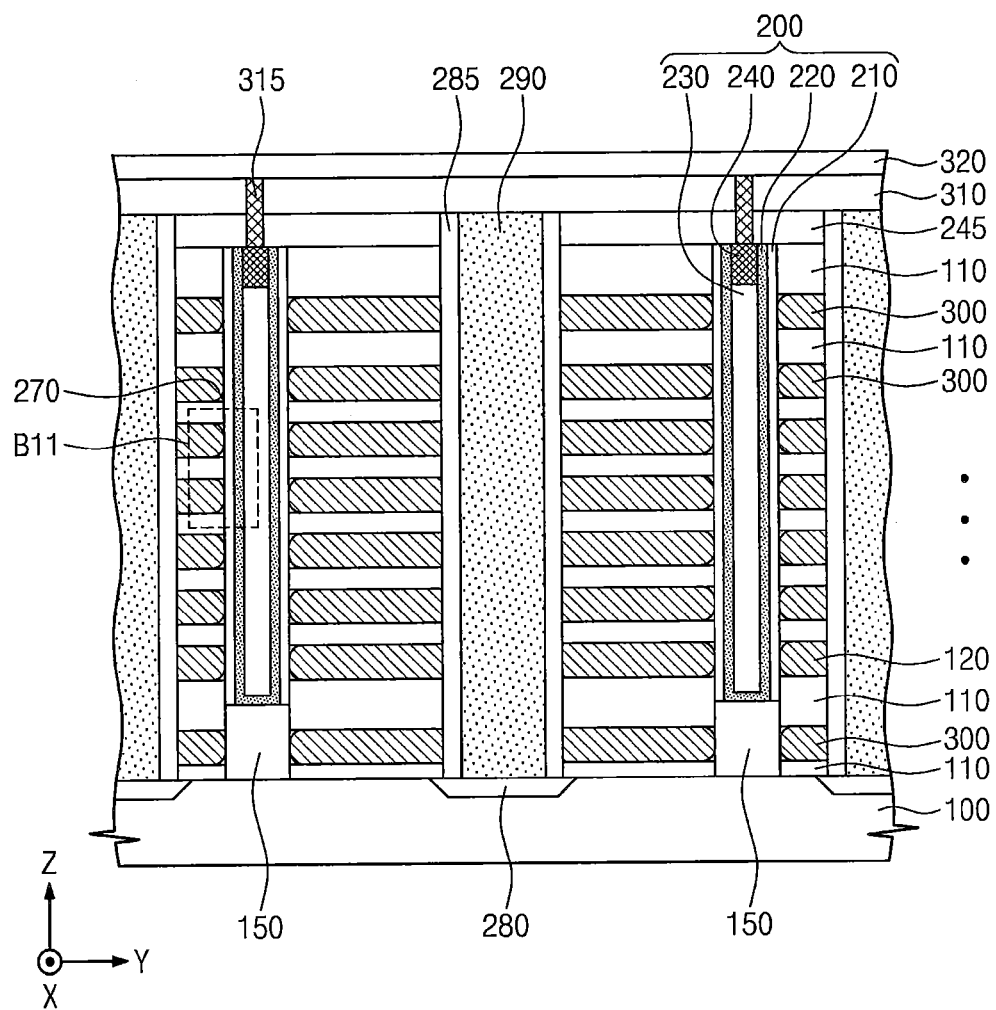
Figure 16B:
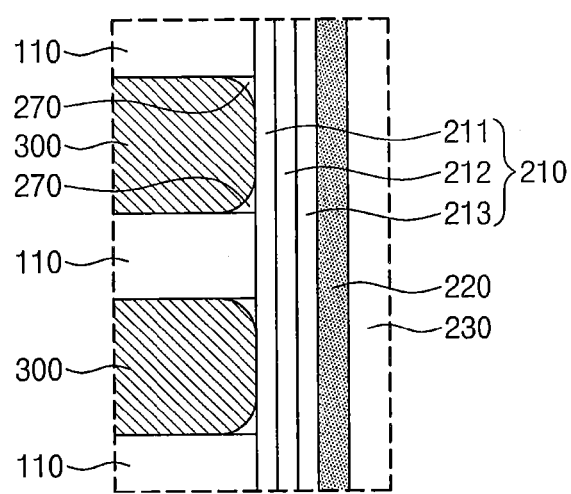

Referring to FIGS. 16A and 16B, a second capping insulating layer 310 may be formed on the first capping insulating layer 245 and the common source line 290. Contact holes exposing an upper surface of the channel pad 240 may be formed in the first capping insulating layer 245 and the second capping insulating layer 310. A bit line contact 315 may be formed in the contact holes. The bit line contact 315 may include a metal such as tungsten or copper.

Thereafter, a bit line 320 in contact with an upper surface of the bit line contact 315 may be formed on the second capping insulating layer 310. The bit line 320 may extend in a Y direction. The bit line 320 may include a metal such as tungsten or copper.

In accordance with some embodiments of the inventive concepts, the corner of the gate electrode may be rounded to have the curved surface by the auxiliary gate insulating pattern. Accordingly, the gate electrode 300 having the rounded corner may suppress the electric field concentrated at the corner of the gate electrode 300. In addition, the auxiliary gate insulating pattern may be formed of a material that has intrinsic negative charges or fixed negative charges. The electrons trapped in the charge trap pattern may be suppressed from migrating along the charge trap pattern by the auxiliary gate insulating pattern. As a result, retention of information may be improved along with device reliability.

Figure 17:
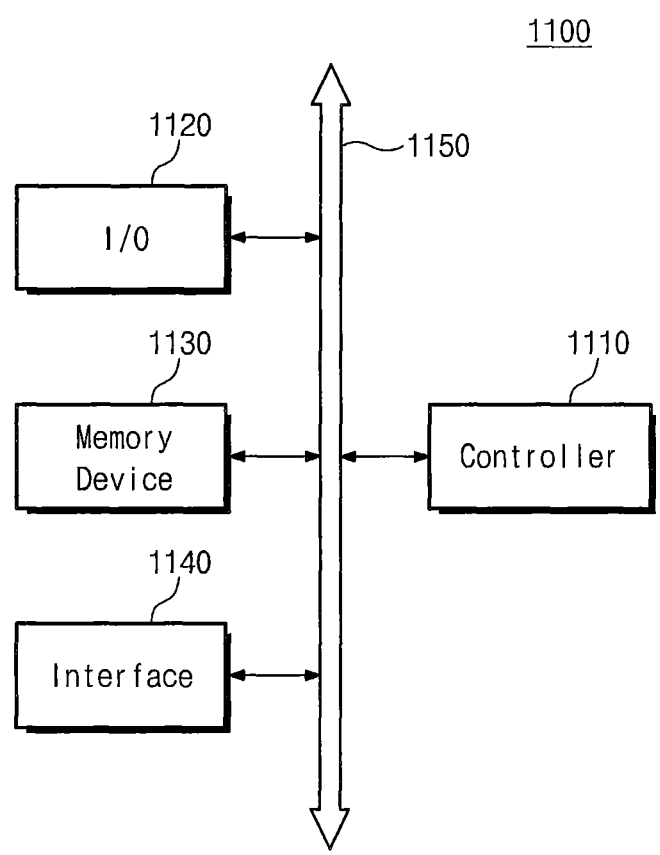
FIG. 17 is a schematic block diagram illustrating an example of electric systems including three dimensional semiconductor memory devices in accordance with some embodiments of the inventive concepts.

FIG. 17 is a schematic block diagram illustrating an example of electric systems including three dimensional semiconductor memory devices in accordance with some embodiments of the inventive concepts. Referring to FIG. 17, the electric system 1100 in accordance with some embodiments of the inventive concepts may include a controller 1110, an input/output (I/O) device 1120, a memory device 1130 and an interface unit 1140 and a data bus 1150.

At least two of the controller 1110, the I/O device 1120, the memory device 1130 and the interface unit 1140 may be communicate with each other through the data bus 1150.

The controller 1110 may include at least one of a microprocessor, a digital signal processor, a micro controller or other logic devices having a similar function thereof. The I/O device 1120 may include a keypad, a keyboard and a display unit. The memory device 1130 may store data and commands. The memory device 1130 may include the three dimensional semiconductor memory devices in accordance with some embodiments of inventive concepts. The memory device 1130 may further include at least one of a phase change memory device, a magnetic memory device, a dynamic random access memory (DRAM) device and/or a static random access memory (SRAM) device. The interface unit 1140 may transmit electrical data to a communication network or may receive electrical data from the communication network. The interface unit 1140 may include an antenna or wired and/or wireless transceiver. Even though not shown in the drawings, the electric system 1110 may further include at least one of a high speed DRAM device and a high speed SRAM device that is used as an operation memory device to improve an operation of the controller 1110.

The electric system 1100 may be applied to a personal digital assistant (PDA), a portable computer, a web tablet, a wireless phone, a mobile phone, a digital music player, a memory card or any device capable of transmitting and/or receiving information in a wireless environment.

Figure 18:
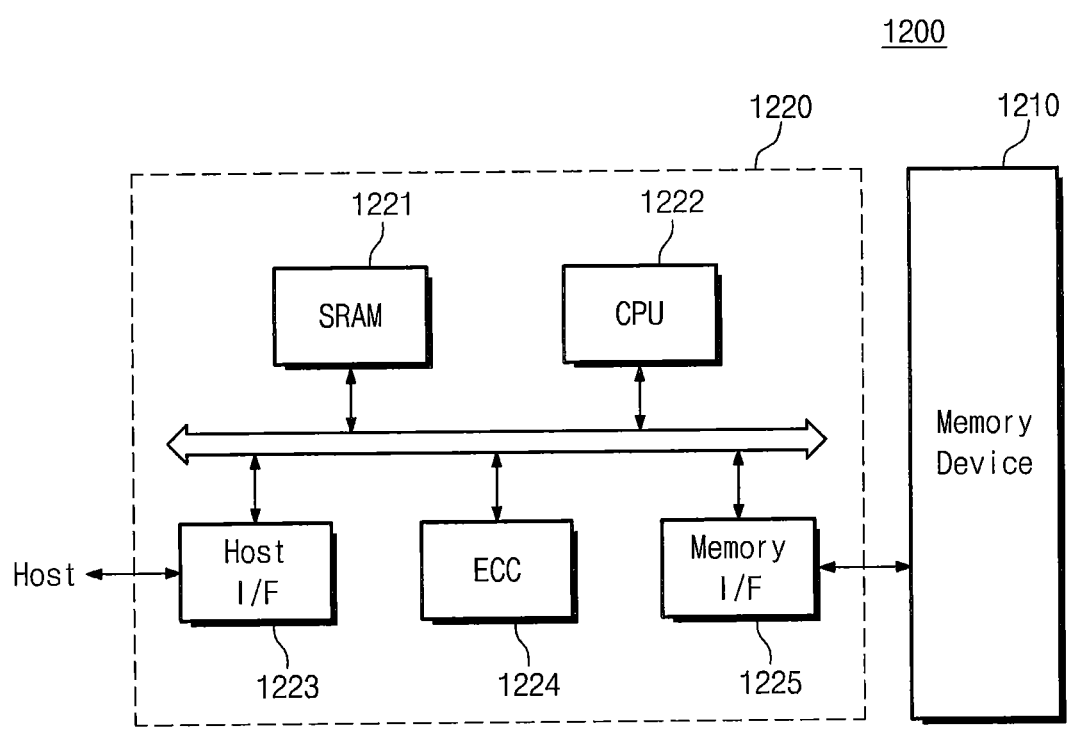
FIG. 18 is a schematic block diagram illustrating an example of memory cards including three dimensional semiconductor memory devices in accordance with some embodiments of the inventive concepts.

FIG. 18 is a schematic block diagram illustrating an example of memory cards including three dimensional semiconductor memory devices in accordance with some embodiments of the inventive concepts. Referring to FIG. 18, the memory card 1200 may include a memory device 1210 in accordance with some embodiments of inventive concepts. The memory device 1210 may include the three dimensional semiconductor memory devices in accordance with some embodiments of inventive concepts. The memory device 1210 may further include at least one of a phase change memory device, a magnetic memory device, a dynamic random access memory (DRAM) device and/or a static random access memory (SRAM) device. The memory card 1200 may include a memory controller 1220 that controls data communication between a host and the memory device 1210. The memory controller 1220 may include a processing unit 1222 that controls overall operations of the memory card 1200. In addition, the memory controller 1220 may include a static random access memory (SRAM) device 1221 that is used as an operation memory of the processing unit 1222. The memory controller 1220 may further include a host interface unit 1223 and a memory interface unit 1225. The host interface unit 1223 may be configured to include a data communication protocol between the memory card 1200 and a host. The memory interface unit 1225 may connect the memory controller 1220 with the memory device 1210. The memory controller 1220 may further include an error check and correction block (ECC) 1224. The error check and correction block 1224 may detect and correct errors of data which are read out from the memory device 1210. Even though not shown in the drawings, the memory card 1200 may further include a read only memory (ROM) device that stores code data to interface with the Host. The memory card 1200 may be used as a portable data storage card. In contrast, the memory card 1200 may be realized as a solid state disk (SSD) that is able to replace a hard disk of computer system.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A three dimensional semiconductor memory device comprising:
   a vertical channel structure extending in a vertical direction on a substrate;
   interlayer insulating layers surrounding the vertical channel structure and being stacked in the vertical direction on the substrate;
   gate electrodes surrounding the vertical channel structure and being disposed between the interlayer insulating layers, corners of the gate electrodes adjacent the vertical channel structure being rounded;
   a vertical insulating layer extending in the vertical direction between the vertical channel structure and the gate electrodes and between the vertical channel structure and the interlayer insulating layers; and
   auxiliary gate insulating patterns disposed between the corners of the gate electrodes and the vertical insulating layer,
   wherein side surfaces of the auxiliary gate insulating patterns are substantially coplanar with side surfaces of the interlayer insulating layers in the vertical direction on the substrate,
   wherein a top surface of a respective one of the auxiliary gate insulating patterns is substantially coplanar with a to surface of a respective one of the gate electrodes adjacent the respective one of the auxiliary gate insulating patterns,
   wherein the top surface of the respective one of the auxiliary gate insulating patterns is a surface of the respective one of the auxiliary gate insulating patterns that is furthest from the substrate, and
   wherein the top surface of the respective one of the gate electrodes is a surface of the respective one of the gate electrodes that is furthest from the substrate.

2. The device of claim 1, wherein the auxiliary gate insulating patterns are vertically arranged along an outer sidewall of the vertical channel structure.

3. The device of claim 1, further comprising a semiconductor pattern between the vertical channel structure and the substrate, wherein the semiconductor pattern is surrounded by a lowest one of the gate electrodes.

4. The device of claim 3, wherein the semiconductor pattern is in contact with the vertical channel structure and the vertical channel structure is electrically connected to the substrate through the semiconductor pattern.

5. The device of claim 1, wherein the vertical channel structure is configured to store charges of a first polarity, and
   wherein the auxiliary gate insulating patterns comprise a material having fixed charges of a second polarity configured to repel the charges of the first polarity in portions of the vertical channel structure that are adjacent the auxiliary gate insulating patterns.

* * * * *